United States Patent
Jeong et al.

(10) Patent No.: US 7,349,262 B2
(45) Date of Patent: Mar. 25, 2008

(54) METHODS OF PROGRAMMING SILICON OXIDE NITRIDE OXIDE SEMICONDUCTOR (SONOS) MEMORY DEVICES

(75) Inventors: Youn-seok Jeong, Seoul (KR); Chung-woo Kim, Suwon-si (KR); Hee-soon Chae, Yongin-si (KR); Ju-hyung Kim, Seongnam-si (KR); Jeong-hee Han, Suwon-si (KR); Jae-woong Hyun, Uijeongbu-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 141 days.

(21) Appl. No.: 11/432,375

(22) Filed: May 12, 2006

(65) Prior Publication Data

US 2006/0291286 A1    Dec. 28, 2006

(30) Foreign Application Priority Data

May 12, 2005    (KR) .................. 10-2005-0039727

(51) Int. Cl.
*G11C 11/34* (2006.01)
*G11C 16/04* (2006.01)

(52) U.S. Cl. .................. 365/185.18; 365/185.26; 365/185.29

(58) Field of Classification Search ........... 365/185.18, 365/185.26, 185.29
See application file for complete search history.

(56) References Cited

U.S. PATENT DOCUMENTS

| 7,170,794 B2* | 1/2007 | Kim et al. ............. 365/185.28 |
| 7,184,316 B2* | 2/2007 | Cho et al. ............. 365/185.28 |
| 2003/0224564 A1 | 12/2003 | Kang et al. |

FOREIGN PATENT DOCUMENTS

| JP | 2004-111963 | 4/2004 |
| KR | 1020040046016 A | 6/2004 |
| KR | 1020040072340 A | 8/2004 |

* cited by examiner

*Primary Examiner*—Anh Phung
*Assistant Examiner*—Toan Le
(74) *Attorney, Agent, or Firm*—Volentine & Whitt, PLLC

(57) ABSTRACT

A method of programming a silicon oxide nitride oxide semiconductor (SONOS) memory device is provided. The SONOS memory device includes a substrate, first and second impurity regions spaced apart on the substrate, a gate oxide layer formed over the substrate between the first and second impurity regions, a trap layer formed over the gate oxide layer, an insulation layer formed over the trap layer, and a gate electrode formed over the insulation layer. The method of programming the SONOS device includes writing data into the SONOS memory device by applying a first voltage to the first impurity region, a gate voltage to the gate electrode, and a second voltage to the second impurity region, where the second voltage is a negative voltage.

11 Claims, 9 Drawing Sheets

METHODS OF PROGRAMMING SILICON OXIDE NITRIDE OXIDE SEMICONDUCTOR (SONOS) MEMORY DEVICES

BACKGROUND OF THE INVENTION

1. Field of the Invention

The present invention relates to a method of operating a semiconductor device, and more particularly, the a method of operating a silicon oxide nitride oxide semiconductor (SONOS) memory device.

A claim of priority is made to Korean Patent Application No. 10-2005-0039727, filed on May 12, 2005, in the Korean Intellectual Property Office, the disclosure of which is incorporated herein in its entirety by reference.

2. Description of the Related Art

A silicon oxide nitride oxide semiconductor (SONOS) memory device is a type of non-volatile memory device.

FIG. 1 illustrates the typical structure of a SONOS memory device. Referring to FIG. 1, drain and source regions 12 and 14 are spaced apart at the surface of a substrate 10. A gate oxide layer 16 is disposed on the substrate 10 between the drain and the source region 12 and 14. A trap layer 18 is disposed on the gate oxide layer 16. The trap layer 18 is a storage node layer where bit data is recorded, and is generally formed of a nitride film ($Si_3N_4$). In a data write operation, electrons are trapped in trap sites of the trap layer 18. A barrier layer 20 is formed on the trap layer 18, and blocks an influx of electrons into a gate 22 when the electrons are trapped in the trap layer 18. The barrier layer 20 is formed of, for example, a silicon oxide film. The gate 22 is formed on the barrier layer 20. Although not illustrated, the sides of a gate stacking body including the gate oxide layer 16, the trap layer 18, the barrier layer 20, and the gate 22 are covered by a gate spacer formed of an insulation material.

In the SONOS memory device of FIG. 1, electrons are trapped in the trap layer 18 in a write operation. When the electrons are distributed over a large area of the trap layer 18, it can become difficult to reliably execute an erase operation. That is, electrons in the trap layer 18 which are trapped at the points where holes are injected can be readily removed by an erase operation, while electrons trapped where holes are not injected cannot be readily removed by the erase operation. Consequently, erase efficiency is degraded.

To reduce the size of a region where electrons are trapped in the trap layer 18, a modified SONOS memory device having a narrower trap layer has been introduced. FIG. 2 illustrates the structure of such a modified SONOS memory device.

Referring to FIG. 2, in the modified SONOS memory device, the gate is formed in a region where a portion of the trap layer 18 is formed in the SONOS memory device of FIG. 1, and thus the trap layer 18 is narrower in the SONOS memory device of FIG. 2 than in the SONOS memory device of FIG. 1.

The curves embedded in FIG. 3 illustrate the electric field intensity distributions in the trap layer 18 of the SONOS memory device of FIG. 2 during writing and erasing operations. In particular, the curve 24G denotes an electric field intensity distribution when trapping electrons in the trap layer 18 to record bit data (i.e., a write operation). The curve 26G denotes an electric field intensity distribution when injecting holes into the trap layer 18 to erase the bit data.

Referring to FIG. 3, the center of the curve 24G and the center of the curve 26G are separated from each other. Since distributions of the electrons and holes trapped in the trap layer 18 can be represented by the electric field intensities illustrated by the curves 24Ga and 26G, the displacement between the curves 24G and 26G indicates that positions where the electrons are trapped are different from positions where the holes are trapped. After being trapped in the trap layer 18, it is difficult for electrons and holes to move within the trap layer 18 such that the trapped electrons cannot be completely removed in the erase operation. As the write and erase operations are repeatedly executed, the number of electrons remaining in the trap layer 18 increases, resulting in a decreased on-cell current. Consequently, the difference between the on-cell current and an off-cell current is decreased, and as a result, the reliability of write and erase operations is decreased and device malfunctions can occur.

SUMMARY OF THE INVENTION

According to an aspect of the present invention, a method of programming a silicon oxide nitride oxide semiconductor (SONOS) memory device is provided. The SONOS memory device includes a substrate, first and second impurity regions spaced apart on the substrate, a gate oxide layer formed over the substrate between the first and second impurity regions, a trap layer formed over the gate oxide layer, an insulation layer formed over the trap layer, and a gate electrode formed over the insulation layer. The method of programming the SONOS device includes writing data into the SONOS memory device by applying a first voltage to the first impurity region, a gate voltage to the gate electrode, and a second voltage to the second impurity region, where the second voltage is a negative voltage.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF PREFERRED EMBODIMENTS

Figure 1:
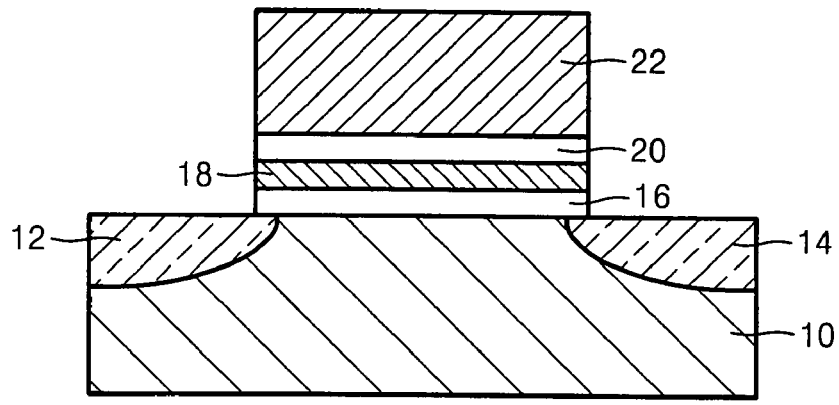
FIG. 1 is a cross-sectional view of a conventional silicon oxide nitride oxide semiconductor (SONOS) memory device.

Hereinafter, the present invention will be described more fully with reference to the accompanying drawings, in which exemplary but non-limiting embodiments of the invention are shown. In the drawings, relative thicknesses and other dimensions of illustrated layers and regions may be exaggerated for clarity. Like reference numbers denote like elements throughout the drawings, and accordingly, efforts have been made to avoid redundancy in the description where possible.

Embodiments of the invention are directed to allowing for operational improvements in silicon oxide nitride oxide semiconductor (SONOS) memory devices by controlling programming voltages applied to the SONOS memory devices.

Figure 2:
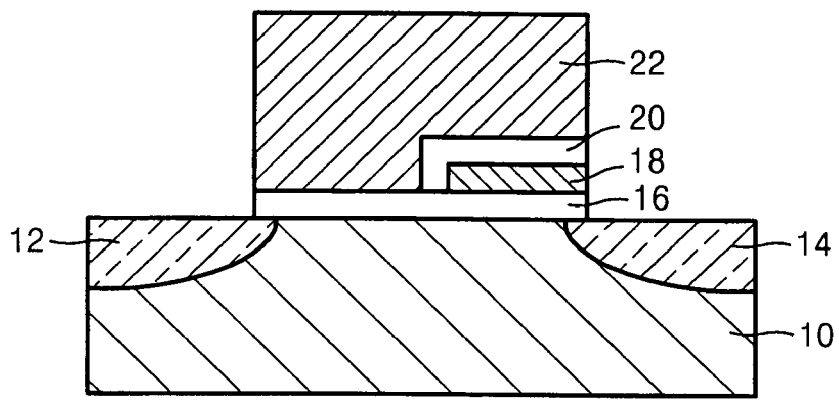
FIG. 2 is a cross-sectional view of another conventional SONOS memory device.
Figure 4:
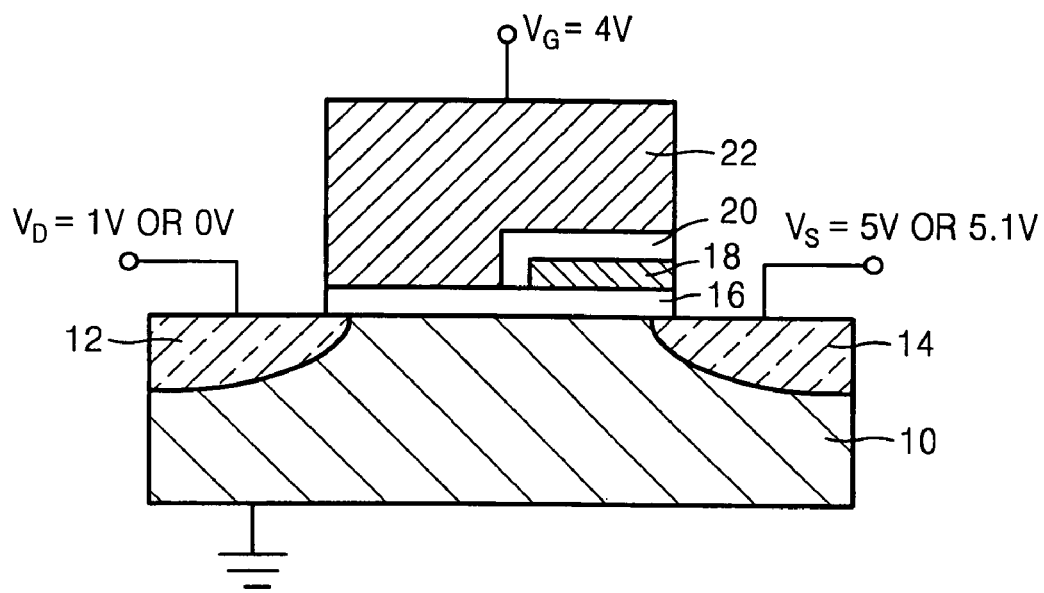
FIG. 4 illustrates conventional applied voltage conditions for the write operation of the SONOS memory device of FIG. 2.

In a conventional method of programming a SONOS memory device such as that shown in FIG. 2, a write operation is performed using channel hot electron injection (CHEI) and an erase operation is performed using hot hole injection (HHI). FIG. 4 illustrates conventional applied voltage conditions during writing of a SONOS memory device, and FIG. 5 illustrates conventional applied voltage conditions during erasing of a SONOS memory device.

Referring to FIG. 4, in a conventional write operation, a source voltage $V_s$ of 5V or 5.1V is applied to the source region 14, a drain voltage $V_d$ of 0V or 1V is applied to the drain region 12, a gate voltage $V_g$ of 4V is applied to the gate 22, and the substrate 10 is grounded.

Figure 5:
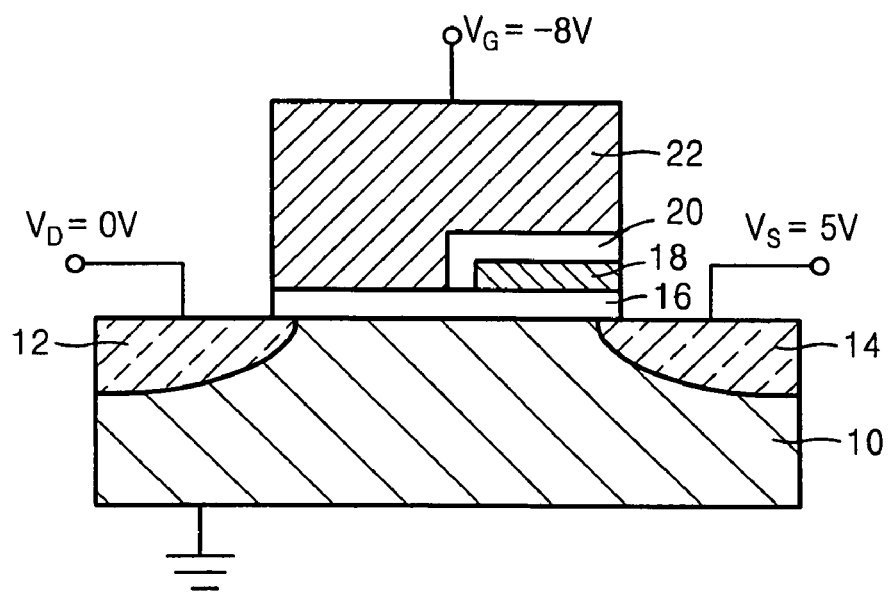
FIG. 5 illustrates conventional applied voltage conditions for the erase operation of the SONOS memory device of FIG. 2.

Referring to FIG. 5, in a conventional erase operation, a source voltage $V_s$ of 5V is applied to the source region 14, a drain voltage $V_d$ of 0V is applied to the drain region 12, a gate voltage $V_g$ of -8V is applied to the gate 22, and the substrate 10 is grounded.

Figure 3:
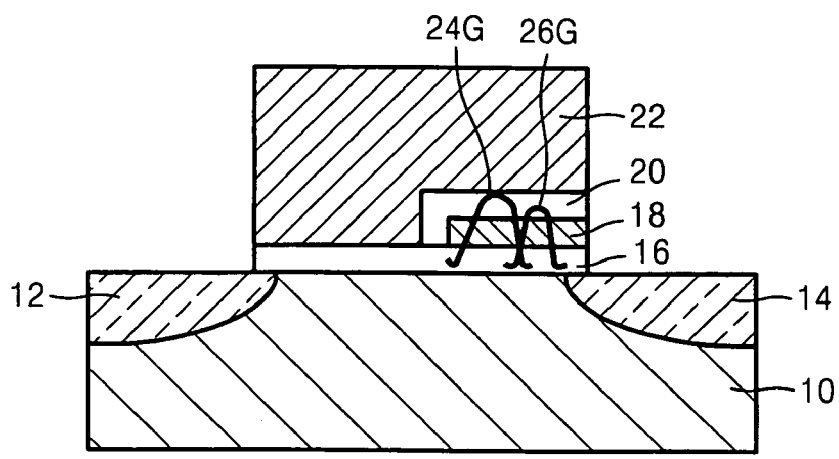
FIG. 3 illustrates electric field intensity distributions in the trap layer of the SONOS memory device of FIG. 2 during write and erase operations according to a conventional method of programming the SONOS memory device of FIG. 2.

As discussed previously, the first curve 24G in FIG. 3 represents an electric field intensity distribution in the trap layer resulting from the conventional voltage application conditions during writing of the SONOS memory device. The second curve 26G in FIG. 3 represents an electric field intensity distribution in the trap layer resulting from the conventional voltage application conditions during erasing of the SONOS memory device.

As explained next, the applied voltage conditions for programming of the SONOS memory device according to embodiments of the present invention differ from the conventional applied voltage conditions described above. In particular, according to embodiments of the present invention, a method of programming a SONOS device includes writing data into the SONOS memory device by applying a first voltage to a first impurity region (e.g., a source region), a gate voltage to a gate electrode, and a second voltage to a second impurity region (e.g., a drain region), where the second voltage is a negative voltage (i.e., less than 0V).

Figure 6:
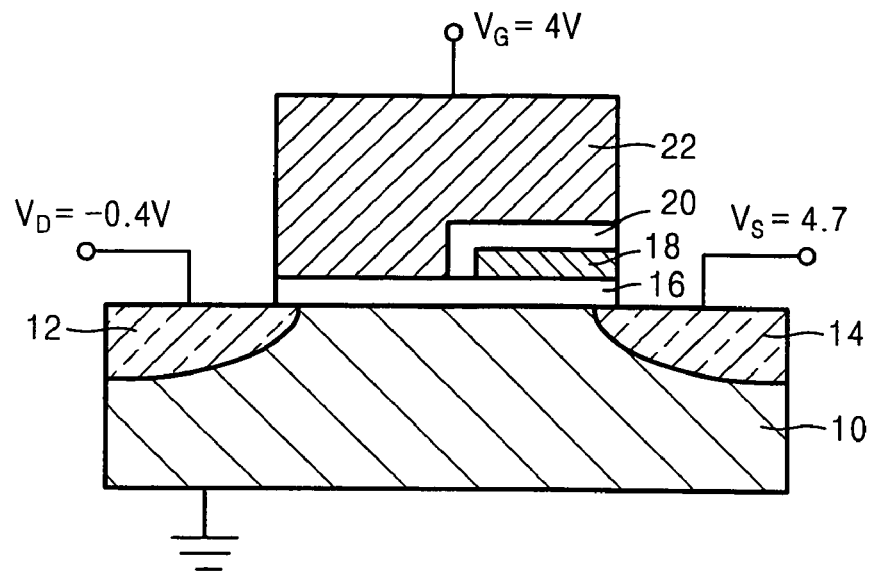
FIG. 6 illustrates voltages applied to source and drain regions and to a gate in a method of programming the SONOS memory device of FIG. 2 according to an embodiment of the present invention.

FIG. 6 illustrates applied voltages during a write operation of a SONOS memory device according to an exemplary embodiment of the present invention.

As shown in FIG. 6, a source voltage $V_s$ of, for example, +4.7V is applied to an impurity region located relatively near the electron injection region in the SONOS memory device, for example, to a source region 14. A drain voltage $V_d$ of less than 0V, for example, -0.4V, is applied to an impurity region located relatively far from the electron injection region, for example, to a drain region 12. In addition, a gate voltage $V_g$ of, for example, 4V is applied to a gate 22, and a substrate 10 is, for example, grounded.

Figure 7:
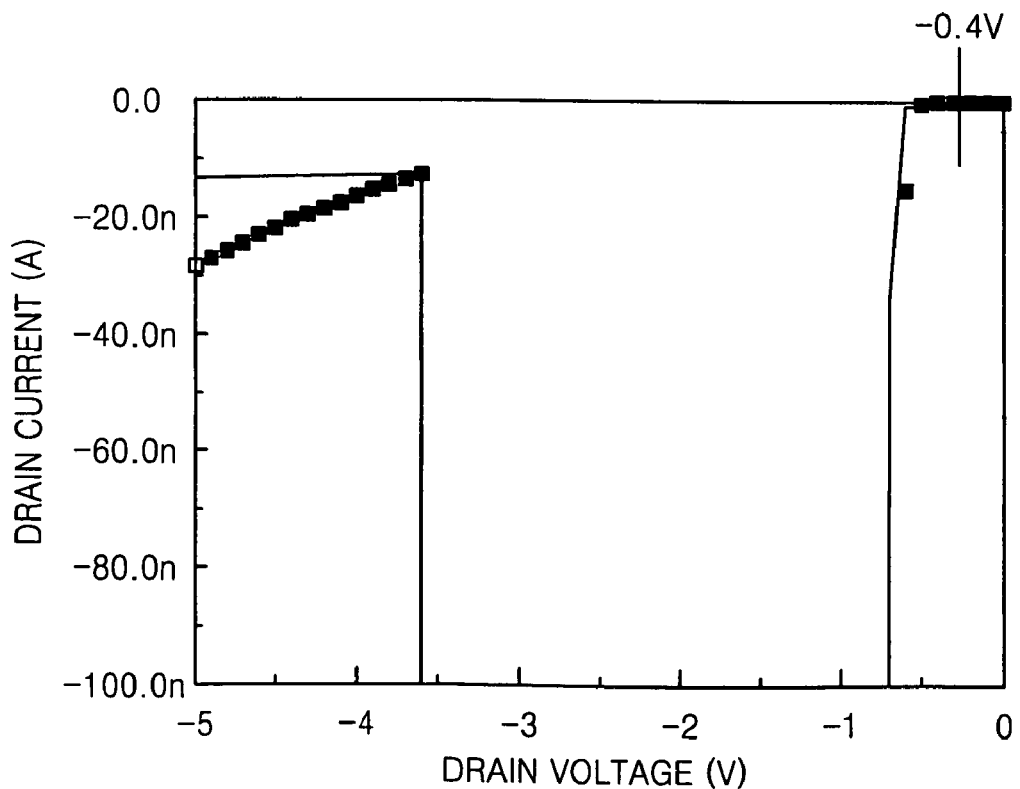
FIG. 7 is graph illustrating current density with respect to a drain voltage of the SONOS memory device of FIG. 2 when programmed according to an embodiment of the present invention.

The invention is not limited to the specific voltages illustrated in FIG. 6. For example, the drain voltage $V_d$ may be less than -0.4V. Specifically, in the writing operation, when the drain voltage $V_d$ is less than -0.4V, for example, -0.5V or less, the current flowing through the substrate 10 substantially increases in magnitude. This is illustrated in FIG. 7 showing current (A) relative to drain voltage (V). However, since no significant problem occurs when a current flows through the substrate 10 in the write operation, the drain voltage $V_d$ may also be lower than -0.4V, for example, -2 to -3V.

Applied voltage conditions for the erasing of a SONOS memory device according to an embodiment of the present invention may, for example, be the same as the conditions illustrated in previously discussed FIG. 5. Namely, a source voltage $V_s$ of 5V may be applied to the source region 14, a drain voltage $V_d$ of 0V may be applied to the drain region 12, a gate voltage $V_g$ of -8V may be applied to the gate 22, and the substrate 10 may be grounded.

Figure 8:
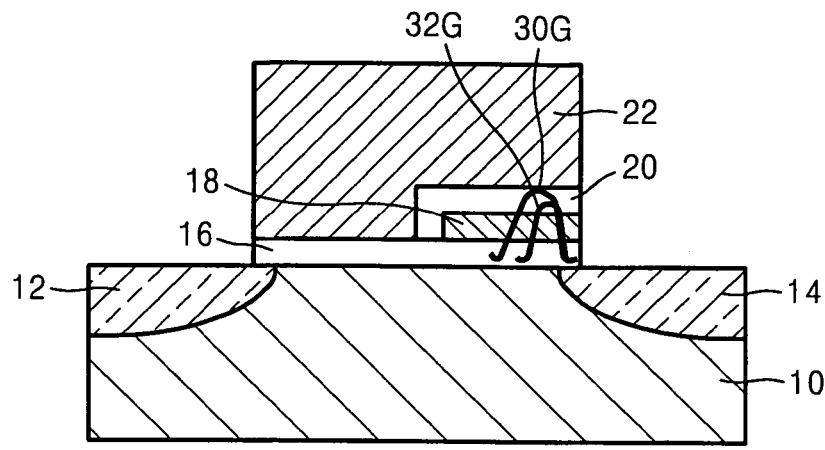
FIG. 8 illustrates electric field intensity distributions in a trap layer of the SONOS memory device of FIG. 2 when programmed according to an embodiment of the present invention.

FIG. 8 illustrates electric field intensity distributions in the trap layer of the SONOS memory device when programmed according to the exemplary embodiment of the present invention. Specifically, in FIG. 8, a first curve 30G represents the electric field intensity distribution in the trap layer when the write operation of the SONOS memory device is executed according to the exemplary embodiment of the present invention. The second curve 32G represents the electric field intensity distribution in the trap layer when the erase operation of the SONOS memory device is executed according to the exemplary embodiment of the present invention.

The first and second electric field intensity distribution curves 30G and 32G of FIG. 8 more closely overlap one another than the distribution curves 24G and 26G of FIG. 3. Accordingly, when the electrical field intensity distribution curves 30G and 32G of FIG. 8 are realized by application of the programming method of the present embodiment, fewer electrons remain trapped in the trap layer 18 after the erase operation is performed, and further, fewer electrons accumulate in the trap layer 18 after the repetition of write and erase operations.

To determine the effectiveness of the programming method according to embodiments of the present invention, the write and erase operations were subjected to a variety of tests. For purposes of testing, SONOS memory devices such as illustrated in FIG. 2 (hereinafter, referred to as test memory devices) were used.

The tests were performed for each of first, second, and third test cases. With respect to write operations, conventional methods were applied as the first and third test cases (see FIG. 4), and a method according to an embodiment of the present invention (see FIG. 6) was applied as the second test case. In particular, for the "first test case", voltages of 4V, 5V, and 1V were applied to the gate 22, the source region 14, and the drain region 12 of the test memory device, respectively. For the "second test case", voltages of 4V, 4.7V, and −0.4V were applied to the gate 22, the source region 14, and the drain region 12 of the test memory device, respectively. For the "third test case", voltages of 4V, 5.1V, and 0V were applied to the gate 22, the source region 14, and the drain region 12 of the test memory device, respectively. Voltages applied to the substrate 10 were the same (ground) for the first through third test cases.

With respect to erase operations, the erase voltages illustrated in FIG. 5 were applied for each of first through third test cases.

On-cell current, endurance, electric field intensity distribution in the trap layer, off-cell current, and $I_d$-$V_g$ characteristics were measured for each of the first through third test cases. FIGS. 9 through 17 show the results of these experiments and are explained in more detail below.

Figure 9:
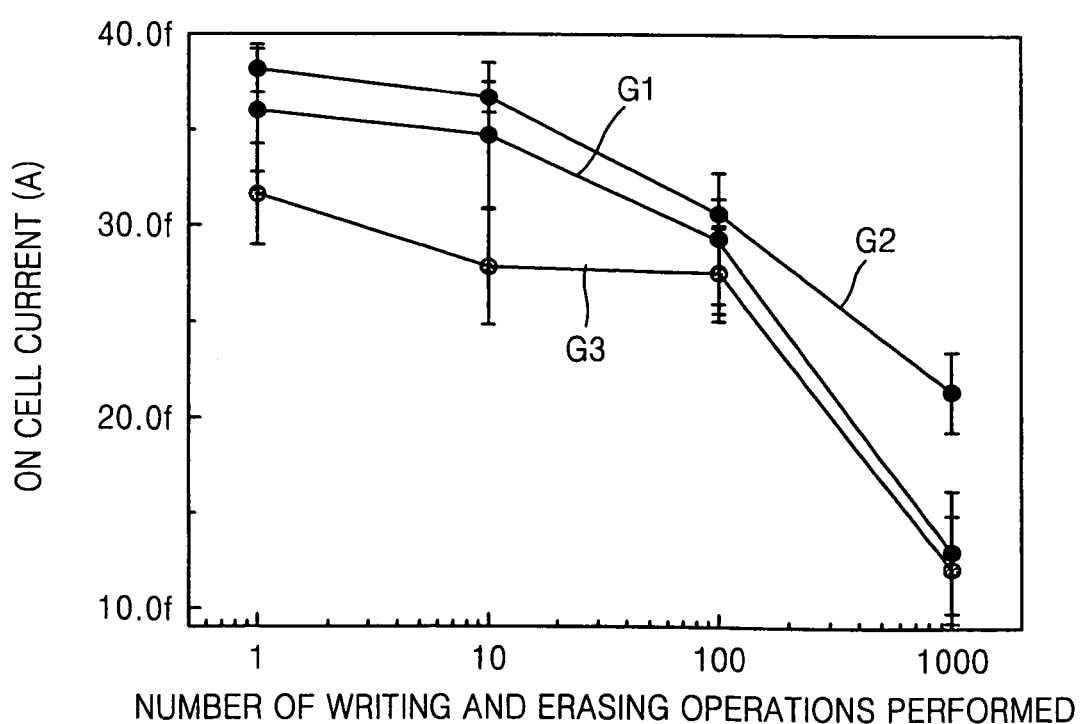
FIGS. 9 through 17 are graphs illustrating comparison results of a conventional method of programming a SONOS memory device and a method of programming a SONOS memory device according to an embodiment of the present invention.
Figure 10:
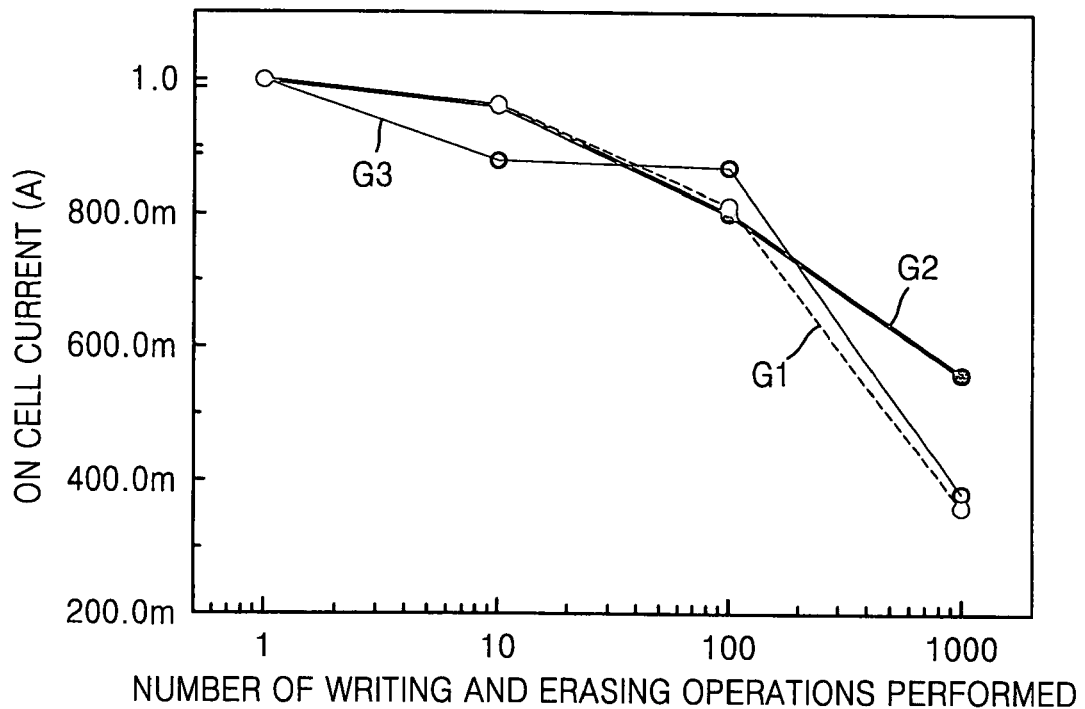

FIG. 9 is a graph logarithmically showing on-cell current (fA) relative to the number of executed write and erase operations for each of the first through third test cases, and FIG. 10 is normalized logarithmic graph showing on-cell current (mA) relative to the number of executed write operations for each of the first through third test cases. In these figures, the curve G1 shows the on-cell current for the first test case, the curve G2 shows the on-cell current for the second test case, and the curve G3 shows the on-cell current for the third test case.

The on-cell current decreases as the executed number of write and erase operations increases, as indicated by the first through third curves G1, G2, and G3. However, the on-cell current in the second test case decreases to a lesser extent than those in the first and the third test cases. More specifically, in the test cases of the conventional method, i.e., the first and third test cases, the on-cell currents drop to about 10 fA after the write and erase operations are executed one thousand (1000) times. On the other hand, in the test case of the method according to embodiments of the present invention, i.e., the second test case, the on-cell current is greater than 20 fA even after the write and erase operations are executed one thousand (1000) times. In other words, when the write and erase operations are executed one thousand (1000) times, the on-cell current obtained when using the method according to embodiments of the present invention is 20% more than the on-cell current obtained when using the conventional methods.

Figure 11:
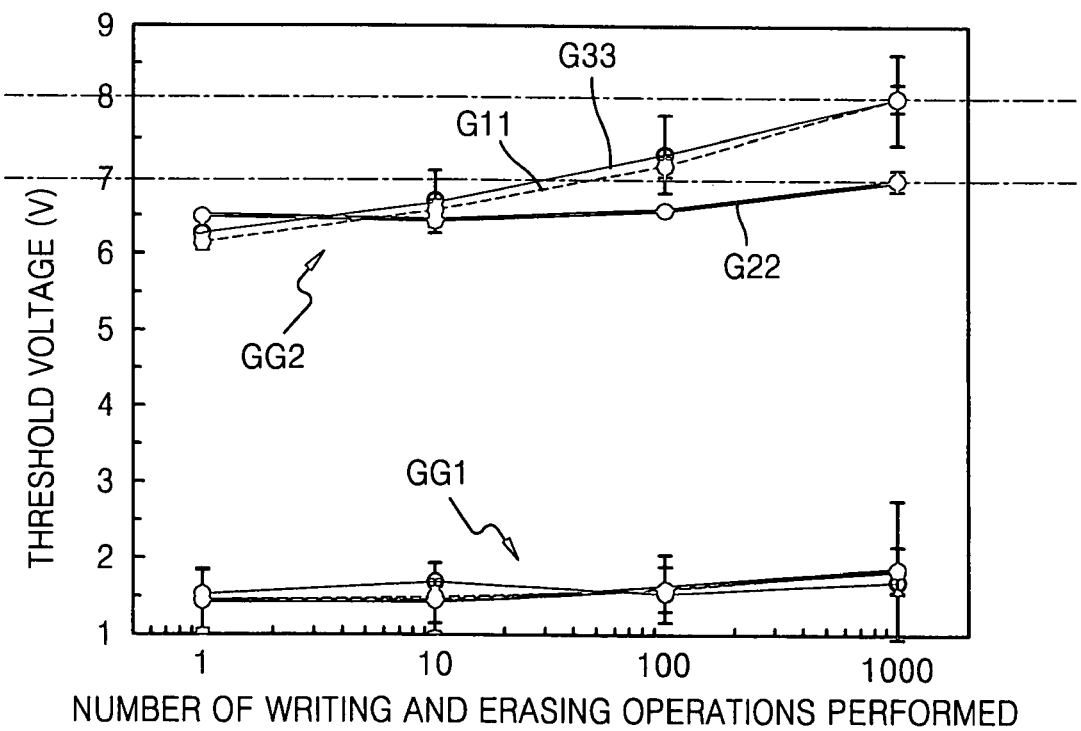
Figure 12:
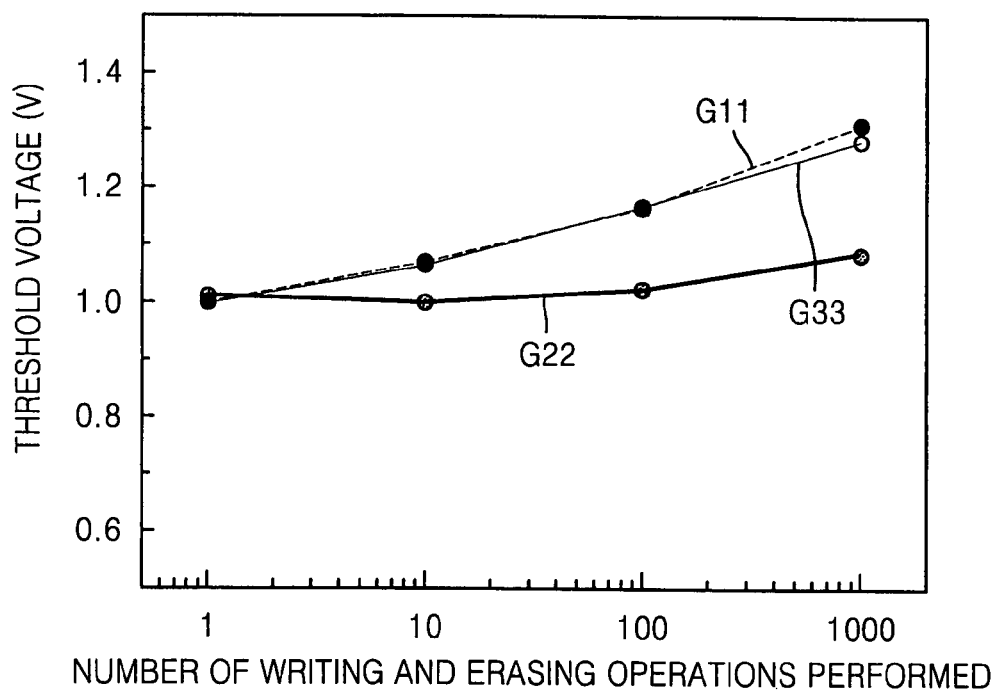

FIG. 11 is a graph logarithmically showing threshold voltages (V) relative to the number of executed write and erase operations for each of the first through third test cases. FIG. 12 is a normalized logarithmic graph showing the same threshold voltages (V) relative to the number of executed write operations for each of the first through third test cases. The data of FIGS. 11 and 12 was obtained using 1 microampere method, in which a voltage present at a time a current is equal to 1 microampere (μA) is set as a threshold voltage in a $I_d$-$V_g$ graph.

In FIG. 11, the group of curves GG1 illustrates threshold voltages relative to the number executed erase operations for the first through third test cases. As shown, there was no signification variation in threshold voltages among the three test cases.

In FIG. 11, the group of curves GG2 illustrates threshold voltages relative to the number of executed write operations. In each write operation, a data bit is recorded in the trap layer 18 (FIG. 6). In particular, the G11 shows threshold voltages for the first test case, the curve G22 shows threshold voltages the second test case, and the curve G33 shows threshold voltages for the third test case. The threshold voltages corresponding to these curves G11, G22 and G33 are also illustrated in the normalized graph of FIG. 12.

As is apparent in FIGS. 11 and 12, the threshold voltages for the first through third test cases increase as write and erase operations are repeated. However, the magnitude of the increase is much greater for the first and third test cases as compared to the second test case. For example, upon execution of one-thousand (1000) the write and erase operations, the threshold voltages for the first and third test cases increases above 8V, while the threshold voltage for the second test case only increases to 7V. This implies that the number of electrons accumulated in the trap layer 18 substantially increases as the write and erase operations are executed for the first and third test cases, but that the increase much less for the second test case.

Figure 13:
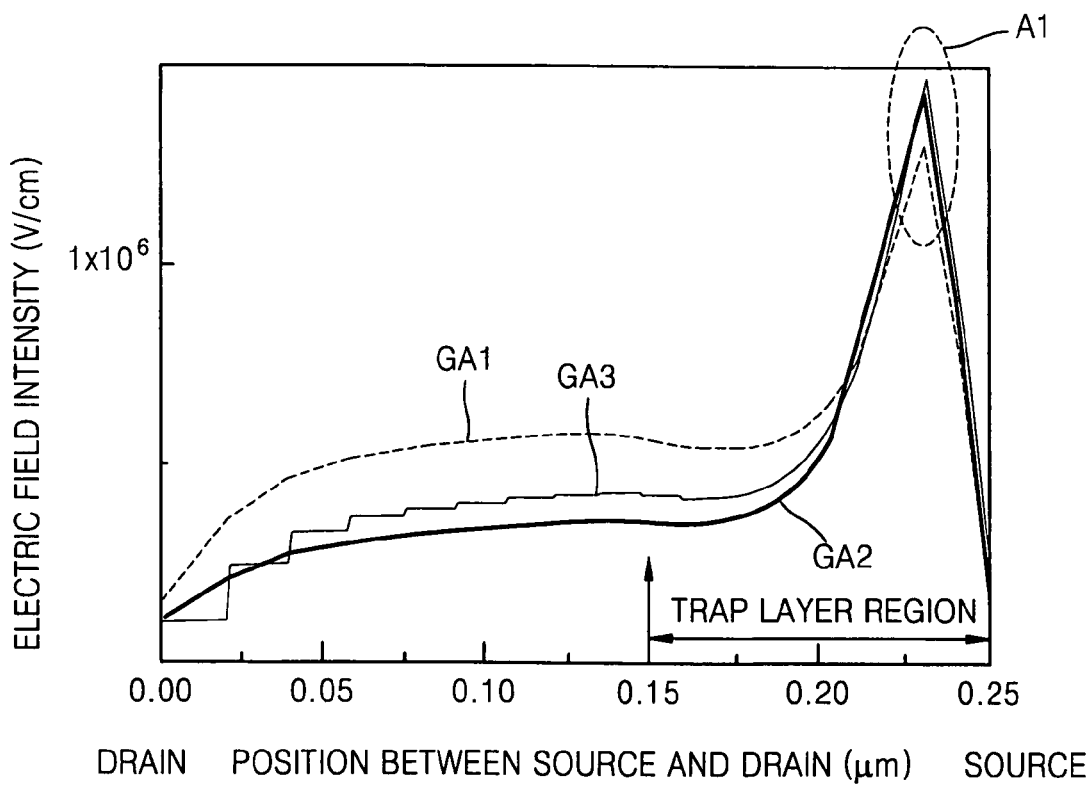

FIG. 13 is a graph showing the distribution (μm) in electric field intensity (V/cm) between the drain region 12 and the source region 14 for each of the first through third test cases. In FIG. 13, the curve GA1 depicts the first test case, the curve GA2 depicts the second test case, and the curve GA3 depicts the third test case.

As shown in FIG. 13, the peak regions A1 of the electric field intensities of the first through third test cases have similar magnitudes and are positioned within a relatively narrow region of the trap layer 18. On the other hand, outside the peak region A1, the electric field intensity for the second test case is weaker than those of the first and third test cases. This implies that fewer electrons are trapped in the trap layer 18 outside the peak region A1 for the second test case than for the first and third test cases when a write operation is executed. Thus, after write and erase operations are executed, fewer electrons will remain in the trap layer in the second test case than in the first and third test cases. Therefore, as described in connection with FIG. 11, any change in threshold voltage caused by repetitive execution of write and erase operations will be lowest for the second test case among the first through third test cases.

Figure 14:
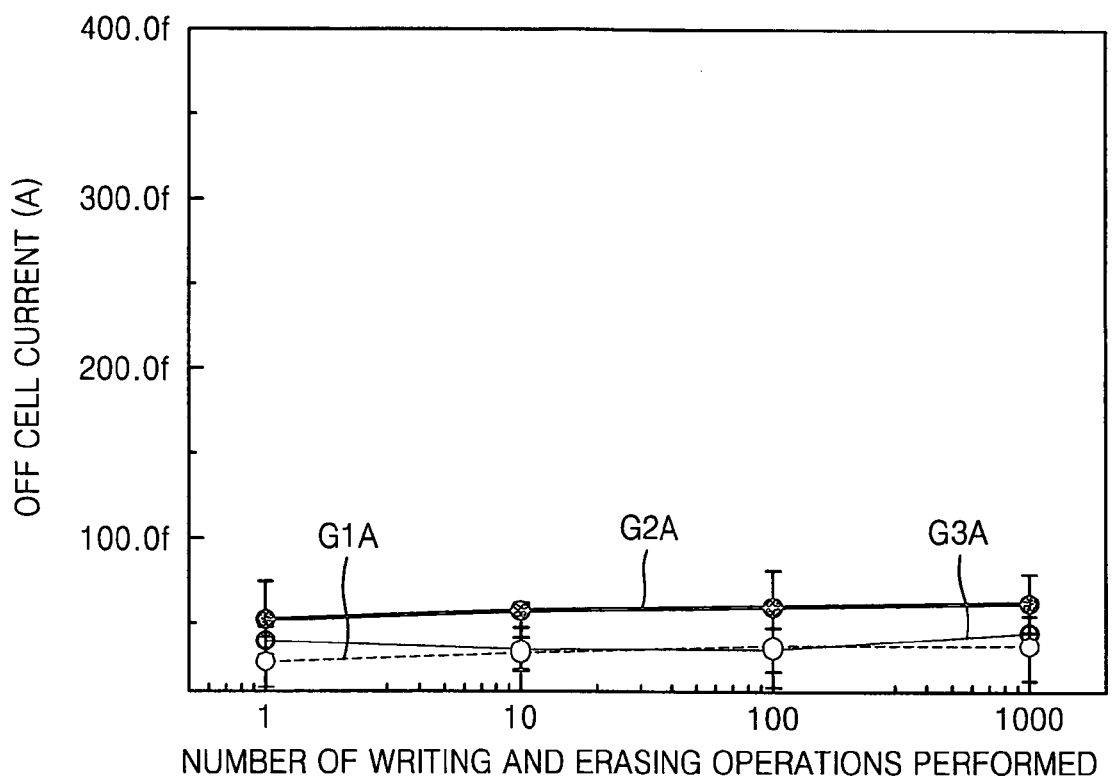

FIG. 14 is a graph showing off-cell current (fA) relative to the number of executed write and erase operations for the first through third test cases. In FIG. 14, the curve G1A depicts the first test case, the curve G2A depicts the second test case, and the curve G3A depicts the third case.

As shown in FIG. 14, there was an relatively insignificant change in off-cell currents for the first through third test cases as the number of executed write and erase operations was increased. Also, there was a relatively insignificant variation (less than 100 fA) in off-cell currents among the first through third test cases.

Figure 15:
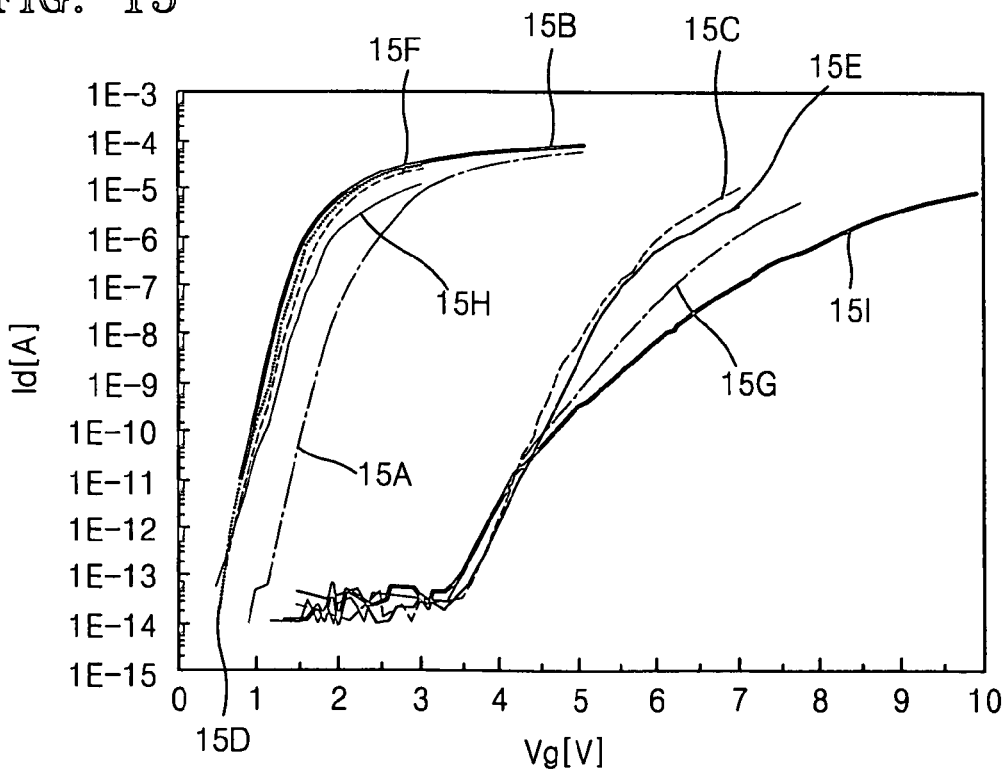
Figure 16:
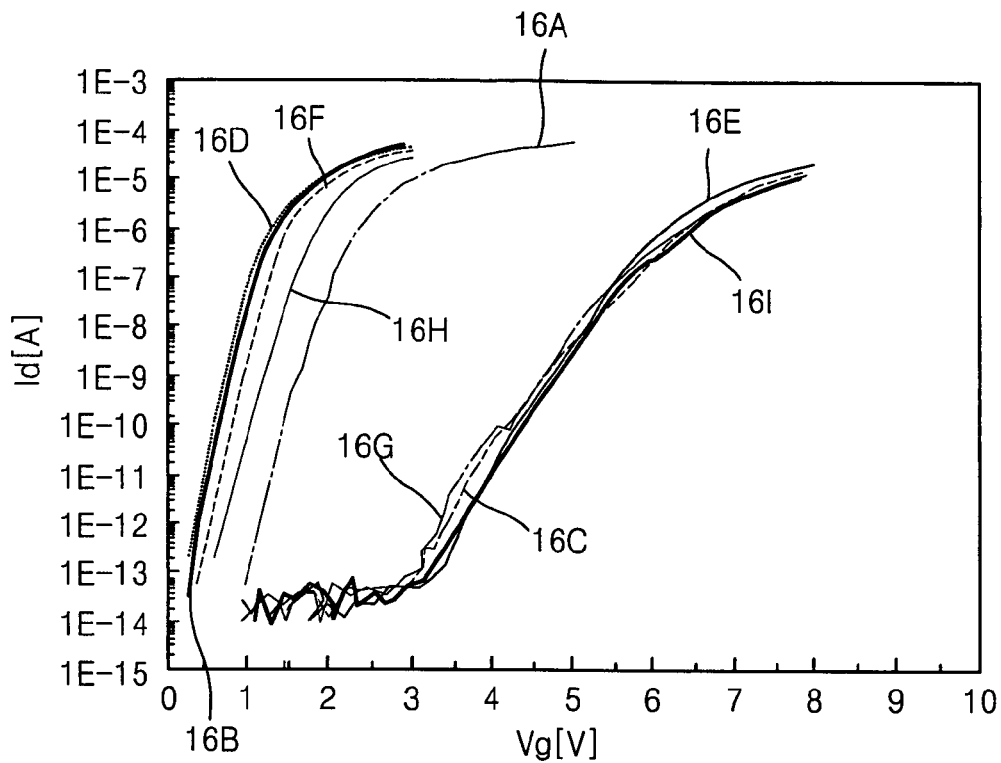
Figure 17:
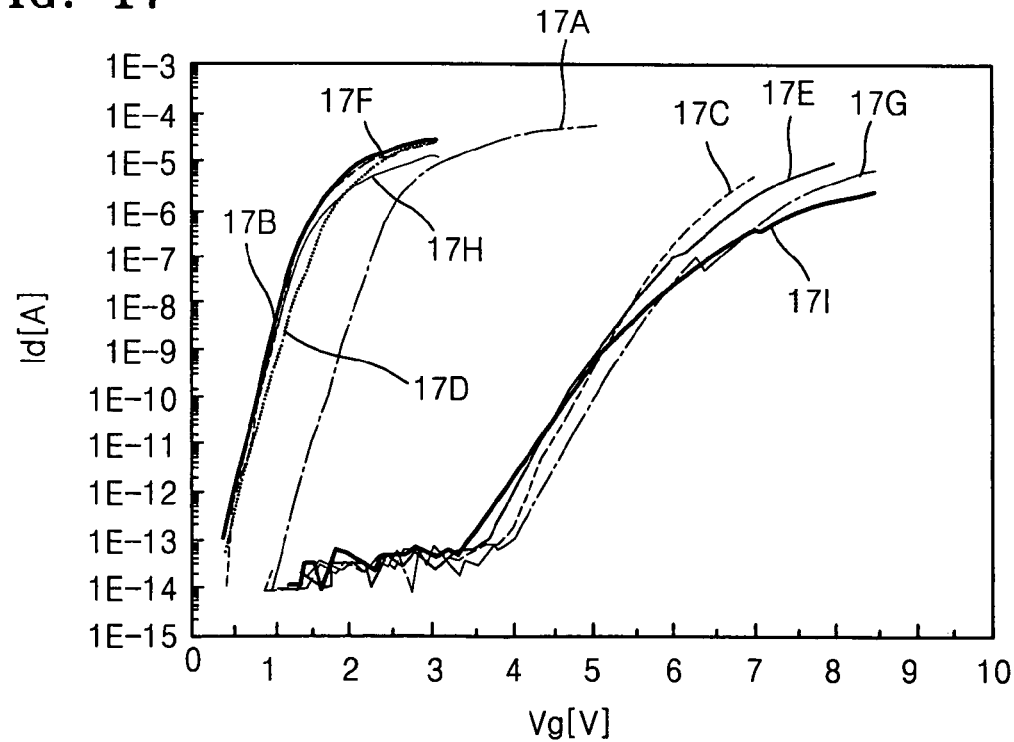

FIGS. 15 through 17 are graphs illustrating $I_d$-$V_g$ curves (drain current (A) v. gate voltage (V)) for the first through third test cases, respectively. In these figures, the $I_d$-$V_g$ curves 15A, 16A, and 17A resulted when the SONOS memory device was first initialized; the $I_d$-$V_g$ curves 15B, 16B, and 17B resulted after performing a single erasing operation; the $I_d$-$V_g$ curves 15C, 16C, and 17C resulted after executing a single writing operation; the $I_d$-$V_g$ curves 15D, 16D, and 17D resulted after executing ten (10) erase operations; the $I_d$-$V_g$ curves 15E, 16E, and 17E resulted after executing ten (10) write operations; the $I_d$-$V_g$ curves 15F, 16F, and 17F resulted after executing one-hundred (100) erase operations; the $I_d$-$V_g$ curves 15G, 16G, and 17G resulted after executing one-hundred (100) write operations; the $I_d$-$V_g$ curves 15H, 16H, and 17H resulted after executing one-thousand (1000) erase operations; and the $I_d$-$V_g$ graphs 15I, 16I, and 17I resulted after executing one-thousand (1000) write operations.

As can be seen in FIGS. 15 through 17, there was no significant change in the $I_d$-$V_g$ characteristics as a result of repetitive execution of the erase operations in each of the first through third test cases. However, the first and third test cases did exhibit significant changes in $I_d$-$V_g$ characteristics as a result of repetitive execution of write operations. That is, upper portions of the $I_d$-$V_g$ curves of the first and third test cases moved to the right, i.e., the gate voltage $V_g$ increased in relation to the drain current $I_d$, as the writing operations were repeated. This indicates that the threshold voltage obtained when the 1-micrometer method is used greatly increases as write operations are repeated. However, in the second test case (corresponding to the method of embodiments of the present invention) did not exhibit significant changes in $I_d$-$V_g$ characteristics as a result of repetitive execution of write operations. This indicates that the threshold voltage was not significantly influenced by the repetition of the write operations in the second test case. As such, the results depicted in FIGS. 15 through 17 verify the results depicted in FIG. 11.

Figure 18:
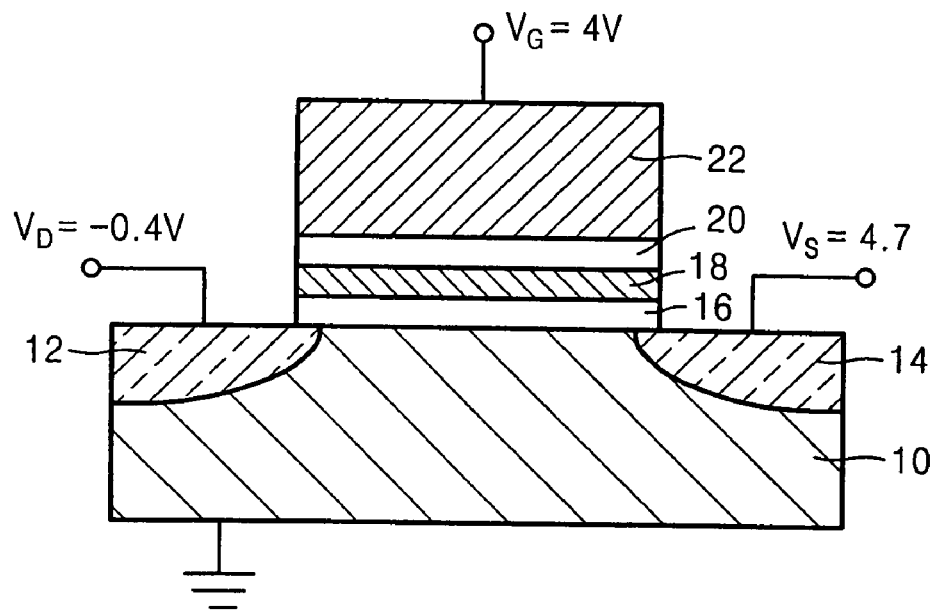
FIG. 18 illustrates voltages applied to source and drain regions and to a gate in a method of programming the SONOS memory device of FIG. 1 according to an embodiment of the present invention.
Figure 19:
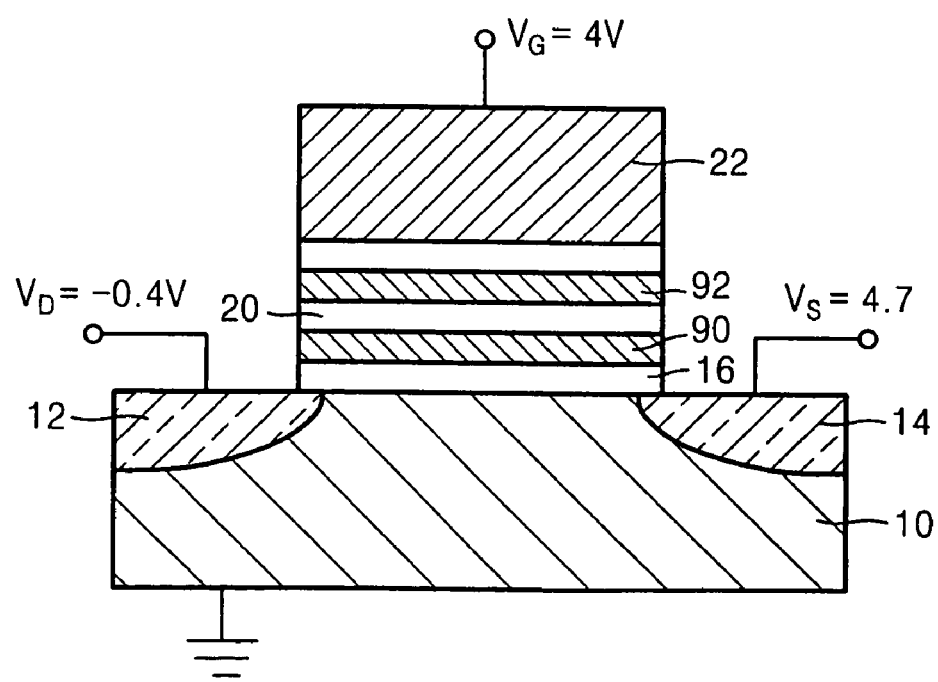
FIG. 19 illustrates voltage applied to source and drain regions and to a gate in a method of programming a SONOS memory device having first and second trap layers according to an embodiment of the present invention.

The above-described methods of programming a SONOS memory device are not limited to the device structure of FIG. 6. For example, the write voltages corresponding to the above-described embodiments (e.g., VG=4V, VS=4.7V, and VD=−0.4V) can be applied to the SONOS memory device structures illustrated in FIGS. 18 and 19 as well. The device structure of FIG. 18 is the same as that of previously described FIG. 1. The device structure of FIG. 19 is a multi-bit structure having first and second trap layers 90 and 92. Here, one or both of the first and second trap layers 90 and 92 may be narrower than the gate 22.

The methods of programming an SONOS memory device according to the embodiments described herein can minimize the reduction of an on-cell current resulting from the repetitive execution of write and erase operations. Accordingly, a sufficient margin between the on-cell current and an off-cell current can be maintained, thus improving device reliability.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming a silicon oxide nitride oxide semiconductor (SONOS) memory device, wherein the SONOS memory device includes a substrate, first and second impurity regions spaced apart on the substrate, a gate oxide layer formed over the substrate between the first and second impurity regions, a trap layer formed over the gate oxide layer, an insulation layer formed over the trap layer, and a gate electrode formed over the insulation layer, said method comprising:

writing data into the SONOS memory device by applying a first voltage to the first impurity region, a gate voltage to the gate electrode, and a second voltage to the second impurity region, wherein the second voltage is a negative voltage.

2. The method of claim 1, wherein a width of the trap layer is narrower than a width of the gate electrode.

3. The method of claim 2, wherein the first voltage is 4.7V, the gate voltage is 4V, and the second voltage is −0.4V.

4. The method of claim 1, wherein the trap layer is a first trap layer, and wherein the SONOS memory device further includes a second trap layer and a barrier layer sequentially stacked between the insulation layer and the gate electrode.

5. The method of claim 4, wherein at least one of the first and second trap layers is narrower than the gate electrode.

6. The method of claim 5, wherein the first voltage is 4.7V, the gate voltage is 4V, and the second voltage is −0.4V.

7. The method of claim 4, wherein the first voltage is 4.7V, the gate voltage is 4V, and the second voltage is −0.4V.

8. The method of claim 1, wherein the first voltage is 4.7V, the gate voltage is 4V, and the second voltage is −0.4V.

9. The method of claim 1, further comprising erasing the data written into the SONOS memory device by applying respective erase voltages to the first and second impurity regions and to the gate electrode.

10. The method of claim 1, wherein the trap layer is a nitride material layer.

11. The method of claim 1, wherein one of the first and second impurity regions is a source region and the other is a drain region.

* * * * *